United States Patent
Ou

(10) Patent No.: US 8,222,707 B2
(45) Date of Patent: Jul. 17, 2012

(54) SEMICONDUCTOR PACKAGE STRUCTURE AND PACKAGE METHOD THEREOF

(75) Inventor: Ying-Te Ou, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 296 days.

(21) Appl. No.: 12/647,871

(22) Filed: Dec. 28, 2009

(65) Prior Publication Data

US 2010/0327429 A1 Dec. 30, 2010

(30) Foreign Application Priority Data

Jun. 29, 2009 (TW) .............................. 98121891 A

(51) Int. Cl.
*H01L 31/0203* (2006.01)
*H01L 21/00* (2006.01)

(52) U.S. Cl. .......... 257/433; 257/98; 257/774; 257/783; 257/787; 438/26; 438/64; 438/127

(58) Field of Classification Search ..................... 257/98, 257/433, 778, 784, 787, E23.067; 438/26, 438/64, 127

See application file for complete search history.

(56) References Cited

U.S. PATENT DOCUMENTS

| | | | | |
|---|---|---|---|---|
| 5,216,278 A * | 6/1993 | Lin et al. | .......... | 257/688 |
| 5,739,585 A * | 4/1998 | Akram et al. | .......... | 257/698 |
| 6,013,948 A * | 1/2000 | Akram et al. | .......... | 257/698 |
| 6,271,056 B1 * | 8/2001 | Farnworth et al. | .......... | 438/106 |
| 6,309,915 B1 * | 10/2001 | Distefano | .......... | 438/127 |
| 6,518,655 B2 * | 2/2003 | Morinaga et al. | .......... | 257/678 |
| 7,015,579 B2 * | 3/2006 | Okada et al. | .......... | 257/738 |
| 7,227,236 B1 * | 6/2007 | Lee et al. | .......... | 257/433 |
| 7,459,729 B2 * | 12/2008 | Yang et al. | .......... | 257/99 |
| 7,989,938 B2 * | 8/2011 | Okada et al. | .......... | 257/680 |
| 2009/0068441 A1 * | 3/2009 | Swaroop et al. | .......... | 428/329 |
| 2010/0013372 A1 * | 1/2010 | Oikawa et al. | .......... | 313/498 |
| 2011/0024853 A1 * | 2/2011 | Sugiyama et al. | .......... | 257/428 |

* cited by examiner

*Primary Examiner* — Nitin Parekh

(74) *Attorney, Agent, or Firm* — Muncy, Geissler, Olds & Lowe, PLLC

(57) ABSTRACT

A semiconductor package structure and a package method thereof are provided. The semiconductor package structure includes a substrate, a sensing chip, a first patterned conductive layer and a electrical connection portion. The substrate has an accommodating portion, a first surface and a second surface opposite to the first surface. The accommodating portion are extended to the second surface from the first surface.

15 Claims, 8 Drawing Sheets

SEMICONDUCTOR PACKAGE STRUCTURE AND PACKAGE METHOD THEREOF

This application claims the benefit of Taiwan application Serial No. 98121891, filed Jun. 29, 2009, the subject matter of which is incorporated herein by reference.

BACKGROUND OF THE INVENTION

1. Field of the Invention

The invention relates in general to a semiconductor package structure and a package method thereof, and more particularly to a sensing chip buried in the semiconductor package structure of the substrate and a package method thereof.

2. Description of the Related Art

Referring to FIG. 1, a generally known semiconductor package structure is shown. The semiconductor package structure 100 includes a sensing chip 102 and a substrate 104. The sensing chip 102 is disposed on the surface 106 of the substrate 104, and the wire 108 electrically connects the sensing chip 102 and the substrate 104 by way of wire-bonding. In order to protect the wire 108 and the sensing chip 102, normally, the wire 108 and the sensing chip 102 are enveloped by an encapsulant 110. The encapsulant 110 must expose the sensing area 112 of the sensing chip 102 so as to sense the to-be-sensed object, such as a finger, when the to-be-sensed object passes above.

However, during the encapsulating process, the flow of the high-temperature liquid encapsulant is hard to control, so the high-temperature liquid encapsulant is likely to cover a partial area of the sensing area 112, such as the partial area A of FIG. 1, hence affecting or even incapacitating the sensing function.

Besides, as the encapsulant 110 is over protruded, the to-be-sensed object, such as a finger, needs to press hard in order to touch the sensing area 112 to be sensed. Apart from the inconvenience of operation, the sensing sensitivity is also affected by the magnitude of the force applied by the finger.

Moreover, the sensing chip 102 is protruded from the top surface 106. For the sensing chip 102 to be enveloped by the encapsulant 110, the height of the encapsulant 110 must be higher than the wire 108 and the sensing chip 102. Therefore, the height H1 of the whole semiconductor package structure 100 cannot be reduced, the semiconductor package structure 100 becomes clumsy, and the trend of thinness, compactness and lightweight cannot be met.

SUMMARY OF THE INVENTION

The invention is directed to a semiconductor package structure and a package method thereof. The sensing chip buried in the substrate so that the size of the whole semiconductor package structure is conformed to the trend of thinness, compactness and lightweight.

According to a first aspect of the present invention, a semiconductor package structure is provided. The semiconductor package structure includes a substrate, a sensing chip, a first patterned conductive layer, a hole conductive layer, a second patterned conductive layer and an electrical connection portion. The substrate has an accommodating portion, a through hole, a first surface and a second surface opposite to the first surface. The accommodating portion and the through hole are extended to the second surface from the first surface. The sensing chip disposed in the accommodating portion having an active surface and includes a pad located on the active surface. The first patterned conductive layer is formed on the first surface. The hole conductive layer is formed on the through hole and connected to the first patterned conductive layer. The second patterned conductive layer is formed on the second surface and connected to the hole conductive layer. The electrical connection portion is used for electrically connecting the pad and the first patterned conductive layer.

According to a second aspect of the present invention, a package method for packaging a semiconductor package structure is provided. The package method includes the following steps. A substrate is provided, wherein the substrate has a first surface and a second surface. An accommodating portion and a through hole are formed on the substrate, wherein the accommodating portion and the through hole are extended to the second surface from the first surface. A sensing chip is disposed in the accommodating portion, wherein the sensing chip has an active surface and includes a pad located on the active surface. A first patterned conductive layer is formed on the first surface. A hole conductive layer is formed in the through hole, wherein the through hole is connected to the first patterned conductive layer. A second patterned conductive layer is formed on the second surface, wherein the second patterned conductive layer is connected to the hole conductive layer. A electrical connection portion is formed between the pad and the first patterned conductive layer for electrically connecting the pad and the first patterned conductive layer.

The invention will become apparent from the following detailed description of the preferred but non-limiting embodiments. The following description is made with reference to the accompanying drawings.

DETAILED DESCRIPTION OF THE INVENTION

The invention is elaborated by a number of preferred embodiments disclosed below. However, the disclosure and the accompanying drawings of the following embodiments are for elaboration only, not for limiting the scope of protection of the invention. Moreover, secondary elements are omitted in the following embodiments to highlight the technical features of the invention.

First Embodiment

Figure 2:
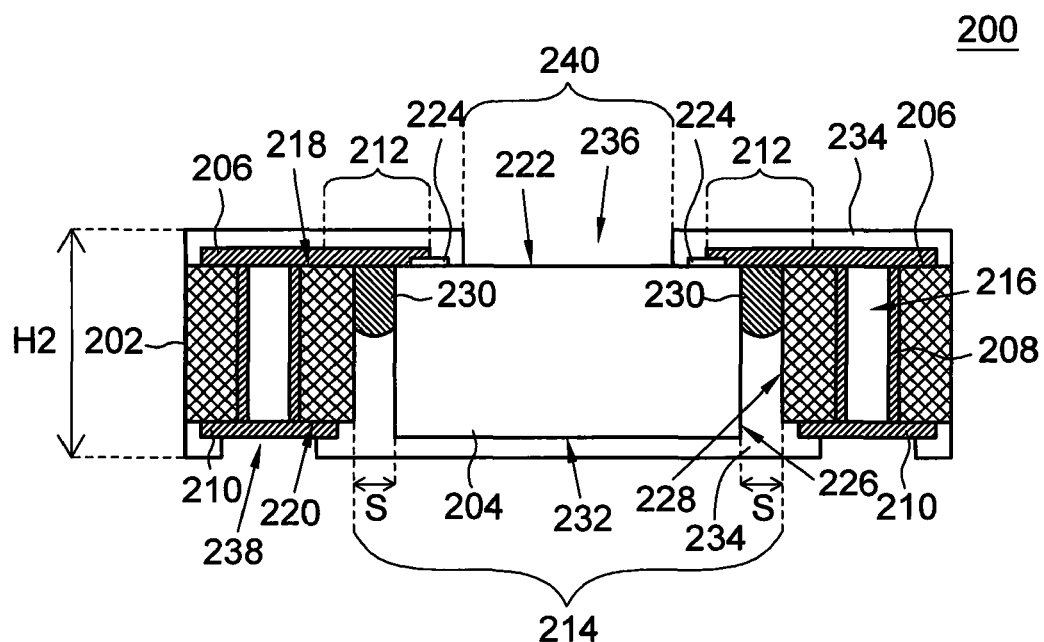
FIG. 2 shows a semiconductor package structure according to a first embodiment of the invention.

Referring to FIG. 2, a semiconductor package structure according to a first embodiment of the invention is shown.

The semiconductor package structure 200 includes a substrate 202, a sensing chip 204, a first patterned conductive layer 206, a hole conductive layer 208, a second patterned conductive layer 210 and an electrical connection portion 212.

The substrate 202, such as a cupper-clad laminate, includes an accommodating portion 214, a plurality of through holes 216, a first surface 218 and a second surface 220 opposite to the first surface 218. The accommodating portion 214 and the through hole 216 are extended to the second surface 220 from the first surface 218. The sensing chip 204, disposed in the accommodating portion 214, has an active surface 222 and includes a plurality of pads 224. The pads 224 are located on the active surface 222. Preferably but not limitedly, the pads 224 are near the peripheral area of the sensing chip 204.

The first patterned conductive layer 206 is formed on the first surface 218. The hole conductive layer 208 is formed on the inner side-wall of the through hole 216 and connected to the first patterned conductive layer 206.

The second patterned conductive layer 210 is formed on the second surface 220 and connected to the hole conductive layer 208.

In the present embodiment of the invention, the electrical connection portion 212 is extended from the first patterned conductive layer 206. Preferably, the electrical connection portion 212 is integrated with the first patterned conductive layer 206. Furthermore, the electrical connection portion 212 is also formed in the process of forming the first patterned conductive layer 206 for electrically connecting the pad 224 and the first patterned conductive layer 206.

Besides, there is a gap S formed between a lateral side 226 of the sensing chip 204 and an inner side-wall 228 of the accommodating portion 214. The semiconductor package structure 200 has an adhesive glue 230, disposed in the gap S, for connecting a lateral side 226 of the sensing chip 204 to an inner side-wall 228 of the accommodating portion 214 for fixing the sensing chip 204 on the accommodating portion 214. The adhesive glue 230 is a thermal cure resin or a copper-containing adhesive glue.

Also, the sensing chip 204 further has a chip surface 232 opposite to the active surface 222. The semiconductor package structure 200 further includes a dielectric layer 234, which covers the first surface 218, the second surface 220, the active surface 222 and the chip surface 232. The dielectric layer 234 has a first aperture 236 and a second aperture 238, wherein the first aperture 236 exposes a part of the active surface 222, (that is, the sensing area 240 of the sensing chip 204), and the second aperture 238 exposes a part of the second patterned conductive layer 210.

The first patterned conductive layer 206, the hole conductive layer 208 and the second patterned conductive layer 210 are electrically connected. After a plurality of tin balls (not illustrated) are formed on the second aperture 238, a circuit board (not illustrated) and the sensing chip 204 can be electrically connected through the tin balls.

Figure 3:
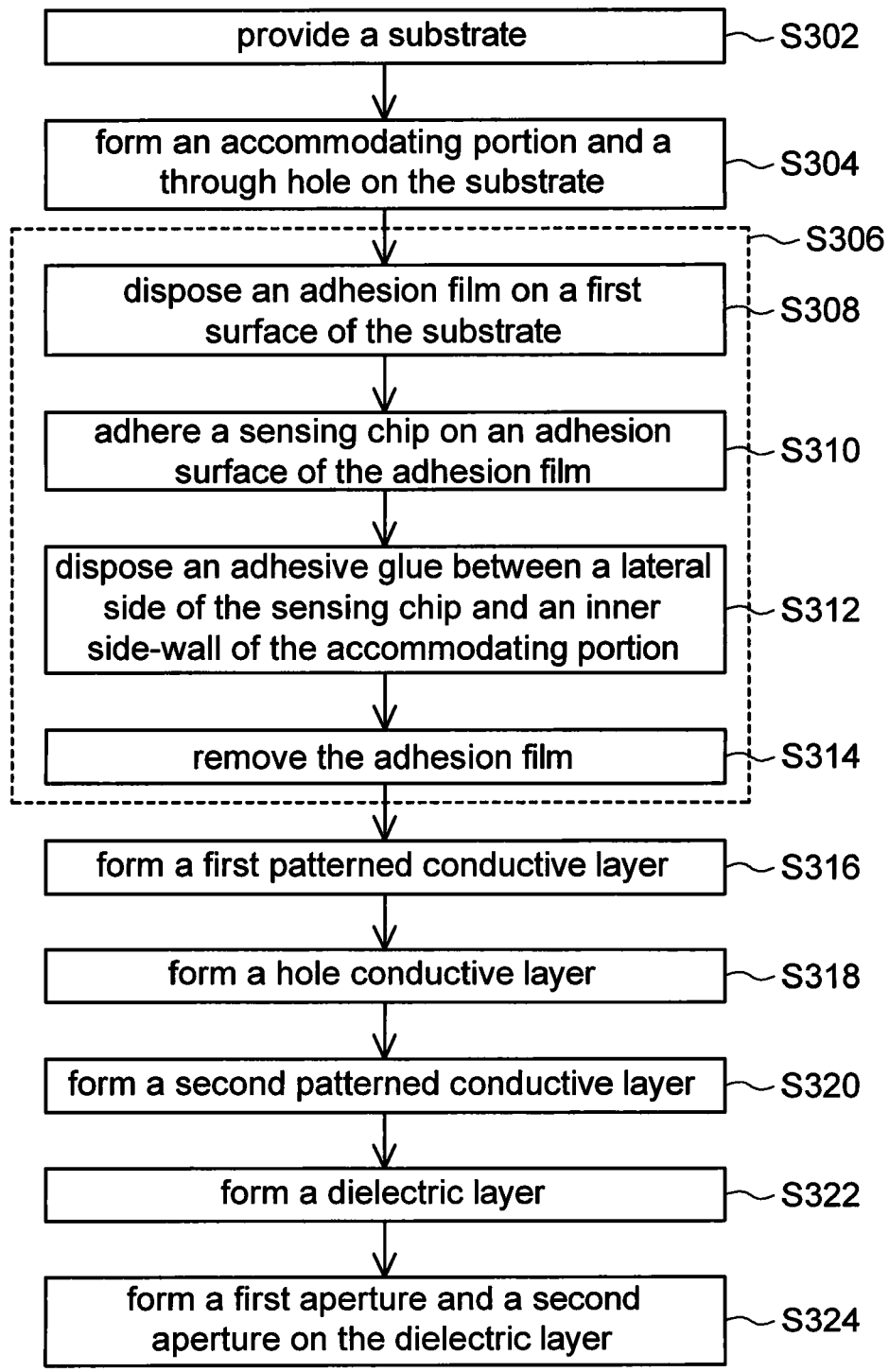
FIG. 3 shows a flowchart of a package method of a semiconductor package structure according to a first embodiment of the invention.

Referring to FIG. 3, a flowchart of a package method of a semiconductor package structure according to a first embodiment of the invention is shown. The present embodiment is elaborated by accompanying drawings as illustrated in FIGS. 4A~4J. FIGS. 4A~4J shows the process of manufacturing the semiconductor package structure of FIG. 2.

Figure 4A:
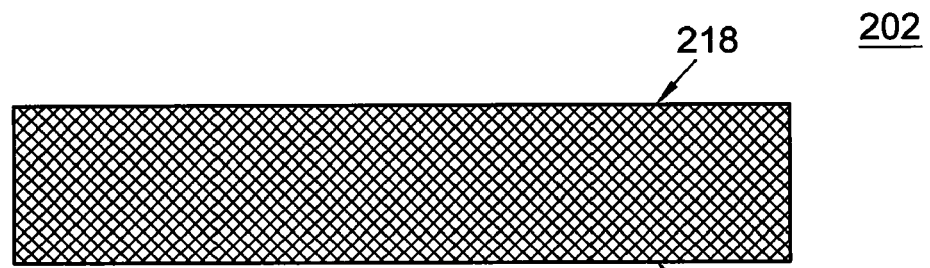
FIGS. 4A~4J shows the process of manufacturing the semiconductor package structure of FIG. 2.

Firstly, the method begins at step S302, also referring to FIG. 4A, a substrate 202 is provided, wherein the substrate 202 has a first surface 218 and a second surface 220.

Figure 4B:
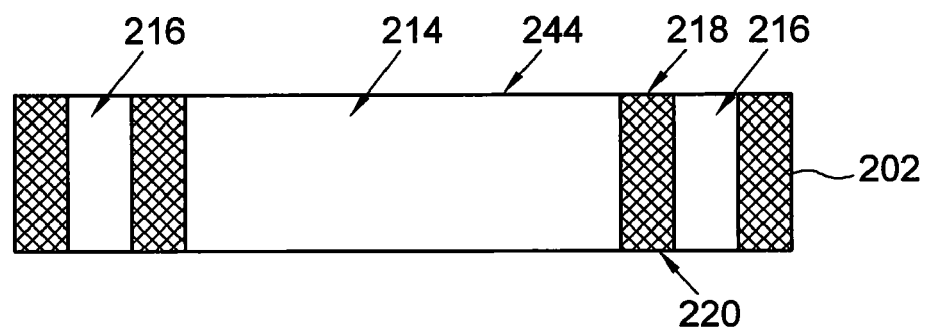
Figure 4C:
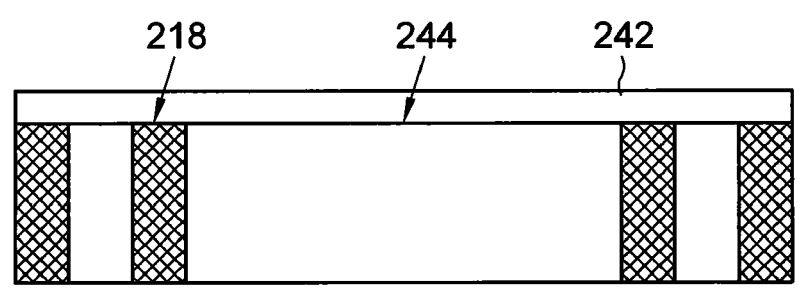

Next, the method proceeds to step S304, also referring to FIG. 4B, an accommodating portion 214 and a through hole 216 are formed on the substrate 202 by the drilling technology such as the mechanical drilling technology. The accommodating portion 214 and the through hole 216 are extended to the second surface 220 from the first surface 218, wherein the accommodating portion 214 exposes an opening 244 on the first surface 218.

Then, the method proceeds to step S306, a sensing chip 204 is disposed in the accommodating portion 214. The present step S306 can be implemented by a plurality of steps. For example, the method may proceed to step S308, also referring to FIG. 4C, an adhesion film 242 is disposed on the first surface 218, so that the adhesion film 242 covers the opening 244. The adhesion film 242 loses adhesion after being heated.

Figure 4D:
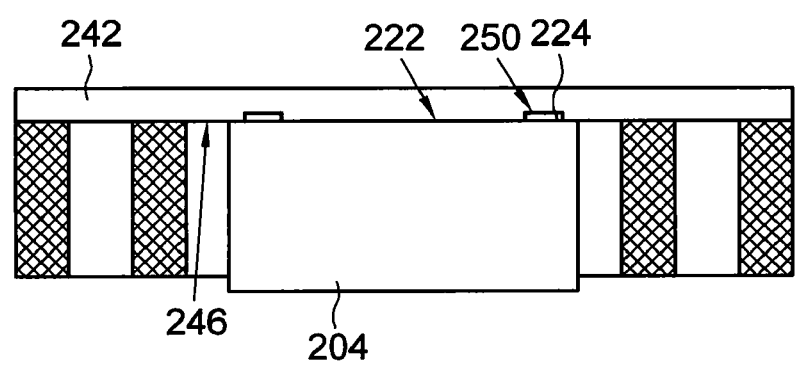

Afterwards, the method proceeds to step S310, also referring to FIG. 4D, a sensing chip 204 is adhered to an adhesion surface 246 of the adhesion film 242, wherein the active surface 222 of the sensing chip 204 faces the adhesion surface 246. The pad 224 of the sensing chip 204 is located on the active surface 222. Preferably but not limitedly, the thickness of the pad 224 is at least greater than 8 μm.

In the present embodiment of the invention, a pad 224, protruded from the active surface 222, has a pad surface 250 facing the same direction with the active surface 222. In the present step S310, the pad surface 250 is adhered to the adhesion surface 246, and the pad 224 is completely embedded into the adhesion film 242, so that the active surface 222 and the first surface 218 are substantially aligned. However, the above exemplification is not for limiting the invention. In other implementations, the pad 224 can be partly embedded into the adhesion film 242, or, the pad surface 250 and the adhesion surface 246 are substantially aligned.

Figure 4E:
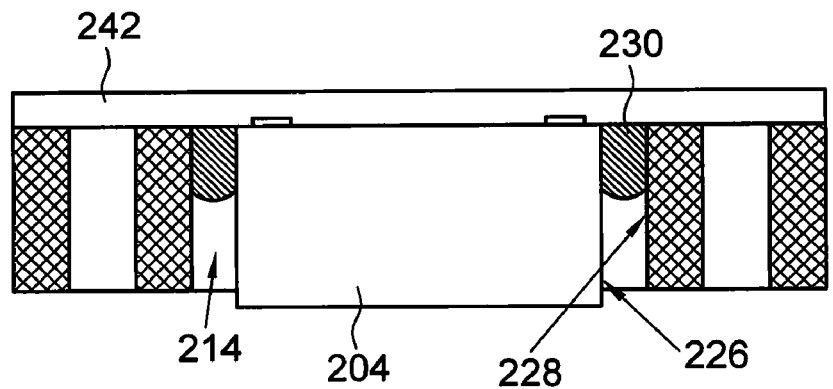

After that, the method proceeds to step S312, also referring to FIG. 4E, an adhesive glue 230 is disposed between a lateral side 226 of the sensing chip 204 and an inner side-wall 228 of the accommodating portion 214 for fixing the sensing chip 204 on the accommodating portion 214, wherein, the materials of the adhesive glue 230 include thermal cure resin.

Figure 4F:
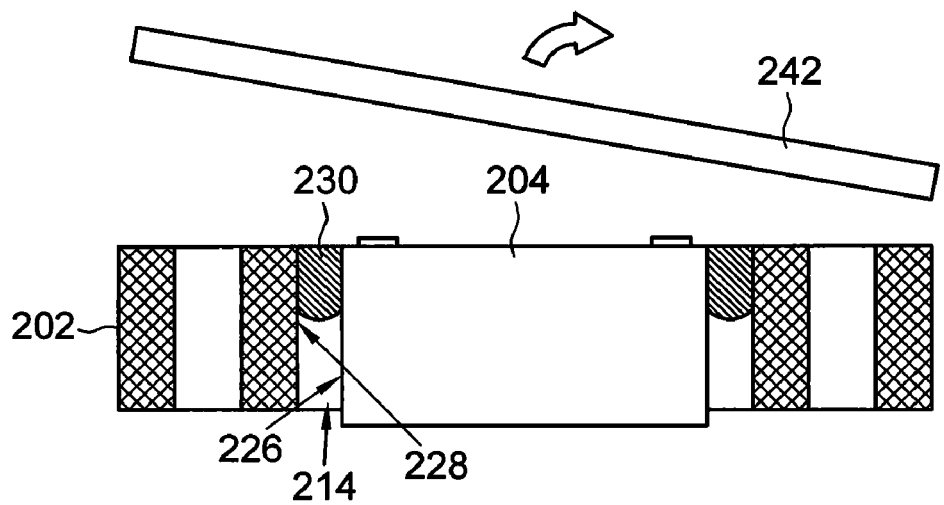

Thereafter, the method proceeds to step S314, also referring to FIG. 4F, the adhesion film 242 can be removed by way of heating. As the materials of the adhesive glue 230 include thermal cure resin, the heating treatment in the step S314 precipitates the solidification of the adhesive glue 230 and reduces the time required for the adhesive glue 230 to adhere the lateral side 226 of the sensing chip 204 and the inner side-wall 228 of the accommodating portion 214. Thus, step S306 is completed, and the sensing chip 204 is disposed in the accommodating portion 214.

Figure 4G:
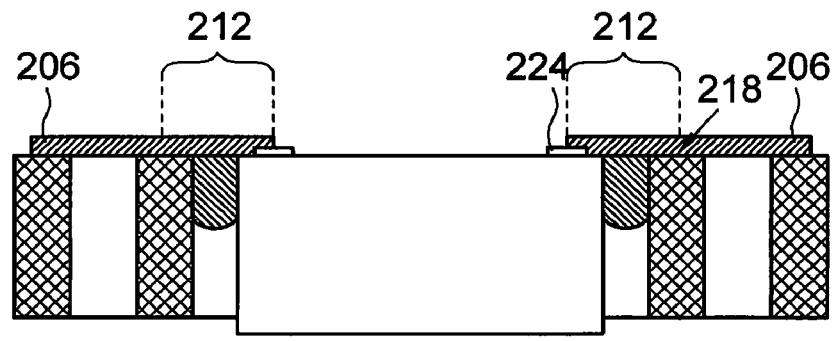

After that, the method proceeds to step S316, also referring to FIG. 4G, a first patterned conductive layer 206 is formed on the first surface 218. The step S316 includes the step of forming the electrical connection portion 212. The electrical connection portion 212 is extended from the first patterned conductive layer 206 and is integrated with the first patterned conductive layer 206. The electrical connection portion 212 is further connected to the pad 224 for electrically connecting the pad 224 and the first patterned conductive layer 206. Furthermore, the electrical connection portion 212 and the first patterned conductive layer 206 are formed by the same process, such as in the electro-plating process for example.

Figure 4H:
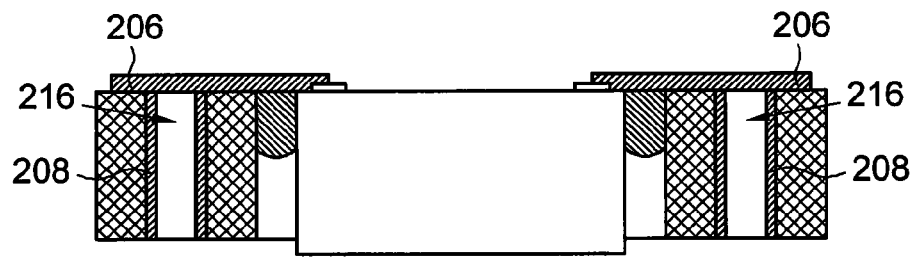

Then, the method proceeds to step S318, also referring to FIG. 4H, a hole conductive layer 208 is formed on the inner-wall of the through hole 216, wherein the hole conductive layer 208 is connected to the first patterned conductive layer 206.

Figure 4I:
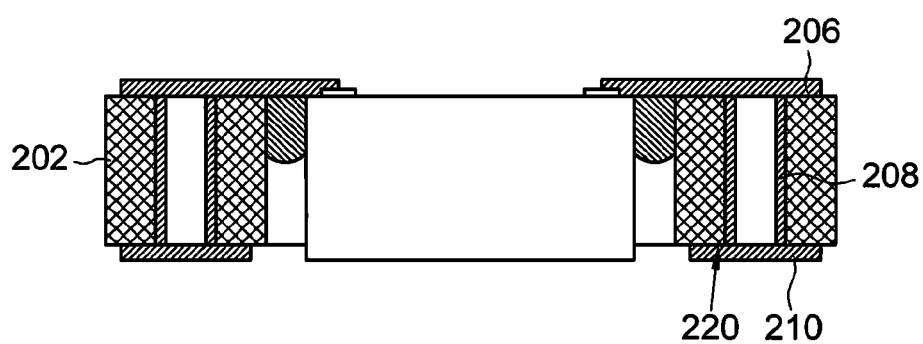

Thereafter, the method proceeds to step S320, also referring to FIG. 4I, a second patterned conductive layer 210 is formed on the second surface 220, wherein the second patterned conductive layer 210 is connected to the hole conductive layer 208.

Steps S316~S320 can be completed by the semi-additive process (SAP). Preferably but not limitedly, the thickness of the first patterned conductive layer 206, the thickness of the hole conductive layer 208 and the thickness of the second patterned conductive layer 210 are at least 10 μm.

Preferably, prior to step S316, the package method may include a step of forming a seeding layer (not illustrated) on the whole external surface of the substrate 202 of FIG. 4F to precipitate the attachment of the copper-plated layer in steps S316-S320. Then, the method proceeds to step S320, the seeding layer (not illustrated) exposed from the external surface of the substrate 202 of FIG. 4I is removed by etching.

Figure 4J:
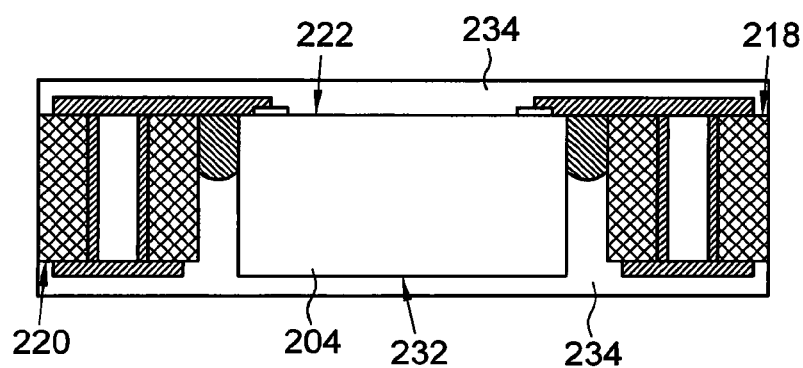

Afterwards, the method proceeds to step S322, also referring to FIG. 4J, the dielectric layer 234 may be formed on the first surface 218, the second surface 220, the active surface 222 and the chip surface 232 by way of screen printing, wherein, the dielectric layer 234 can be made from polymer.

After that, the method proceeds to step S324, a first aperture 236 and a second aperture 238 are formed on the dielectric layer 234 by way of exposing and developing as indicated in FIG. 2. The first aperture 236 exposes the sensing area 240 on the active surface 222, and the second aperture 238 exposes a part of the second patterned conductive layer 210. Thus, the semiconductor package structure 200 of FIG. 2 is completed.

Figure 1:
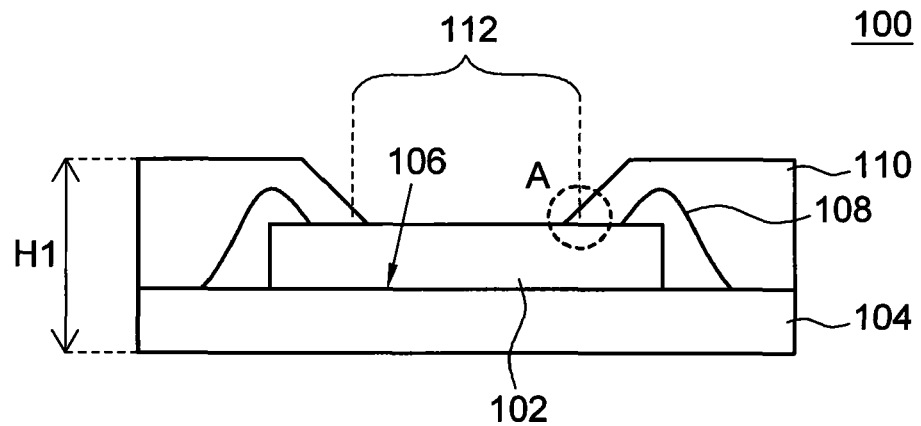
FIG. 1 (Prior Art) shows a generally known semiconductor package structure.

As the first aperture 236 is exposed on the sensing area 240 by way of developing, the first aperture 236 can precisely expose the sensing area 240, and the problem that the sensing area 112 of the generally known semiconductor package structure 100 of FIG. 1 being covered will not occur.

Besides, the sensing chip 204 is buried in the substrate 202, so that the height H2 of the whole semiconductor package structure 200 is lower than the height H1 of the generally known semiconductor package structure 100 of FIG. 1, hence being conformed to the trend of slimness, compactness and light weight.

Also, prior to or following step S324, an organic solderability preservative (OSP) film (not illustrated) can be formed on the second patterned conductive layer 210. Thus, the second patterned conductive layer 210 exposed from the second aperture 238 is protected by the organic solderability preservative film and will not be oxidized.

Compared with the generally known semiconductor package structure 100 of FIG. 1, on the part of the semiconductor package structure of the present embodiment of the invention, the electrical connection portion 212, which electrically connects the sensing chip 204 and the substrate 202, is an electro-plated layer rather than a weak and thin wire, so that a thin dielectric layer 234 can be formed by way of screen printing to protect the electrical connection portion 212. As the dielectric layer 234 is very thin, the whole semiconductor package structure 200 is still conformed to the trend of thinness, compactness and lightweight. As the dielectric layer 234 is very thin, the to-be-sensed object such as a finger can be easily sensed when the to-be-sensed object slightly slides through the sensing area. Thus, the sensing sensitivity is not subjected to how much weight being applied by the user.

Figure 5:
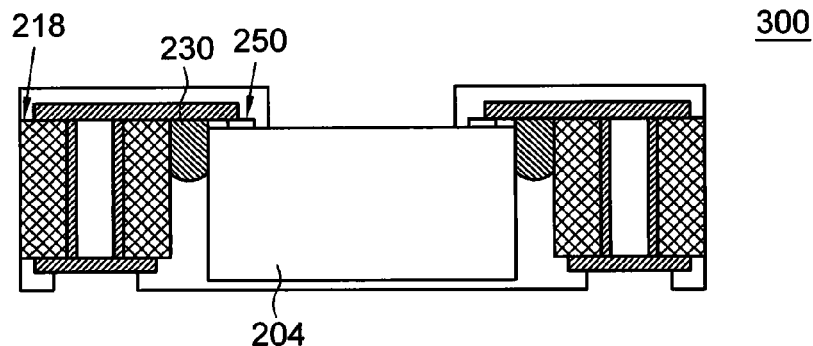
FIG. 5 shows a semiconductor package structure according to another embodiment of the invention.

Referring to FIG. 5, a semiconductor package structure according to another embodiment of the invention is shown. The method proceeds to step S310. If the pad surface 250 and the adhesion surface 246 are substantially aligned and adhered to the adhesion surface 246, then the pad surface 250 and the first surface 218 are substantially aligned as indicated in the semiconductor package structure 300 of FIG. 5.

Besides, when the pad surface 250 and the first surface 218 are substantially aligned, the electro-plated layer can be easily formed by the semi-additive process. Furthermore, if the semi-additive process is adopted in steps S316~S320, then, preferably but not limitedly, the pad surface 250 and the first surface 218 are substantially aligned.

Second Embodiment

Figure 6:
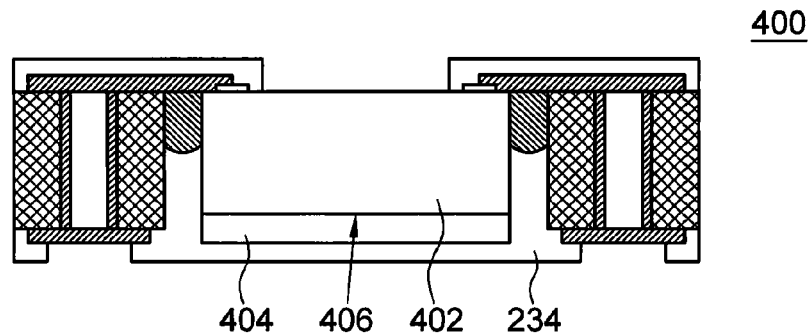
FIG. 6 shows a semiconductor package structure according to a second embodiment of the invention.

Referring to FIG. 6, a semiconductor package structure according to a second embodiment of the invention is shown. For the similarities between the second embodiment and the first embodiment, the same designations are used, and the similarities are not repeated here. The semiconductor package structure 400 of the second embodiment the differs with the semiconductor package structure 200 of the first embodiment in that: the semiconductor package structure 400 further includes a die attach film (DAF) 404 disposed on the chip surface 406 of the sensing chip 402, wherein, the dielectric layer 234 further covers the die attach film 404.

The dielectric layer 234 and the sensing chip 402 have different thermal coefficients. If the area of direct connection between the dielectric layer 234 and the sensing chip 402 is too large, fragmentation may occur to the connection between the sensing chip 402 and the dielectric layer 234. The die attach film 404 of the present embodiment of the invention is located between the sensing chip 402 and the dielectric layer 234, so that the contact area between the sensing chip 402 and the dielectric layer 234 is reduced, hence avoiding fragmentation occurring to the connection between the sensing chip 204 and the dielectric layer 234 due to the area of connection being too large when the sensing chip 402 and the dielectric layer 234 expand or contract as temperature changes.

Third Embodiment

Figure 7:
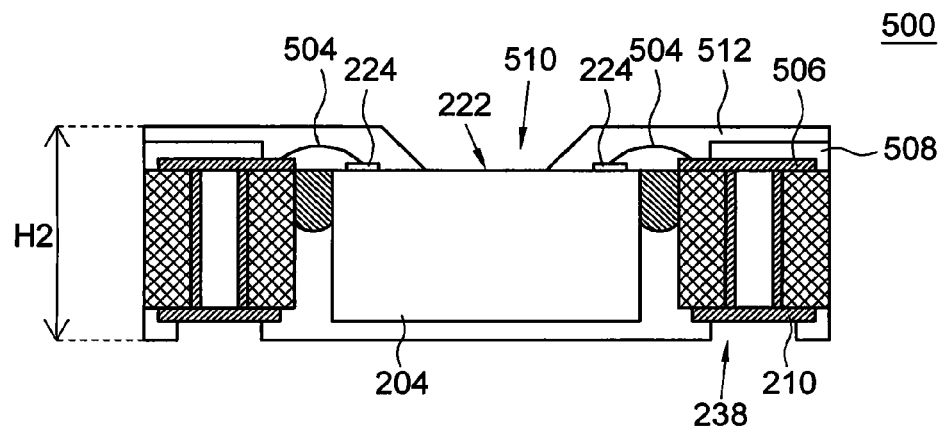
FIG. 7 shows a semiconductor package structure according to a third embodiment of the invention.

Referring to FIG. 7, a semiconductor package structure according to a third embodiment of the invention is shown. For the similarities between the third embodiment and the first embodiment, the same designations are used, and the similarities are not repeated here. The semiconductor package structure 500 of the third embodiment differs with the semiconductor package structure 200 of the first embodiment in that: the electrical connection portion is the wire 504, one end of the wire 504 is connected to the pad 224, and the other end of the wire 504 is connected to the first patterned conductive layer 506.

Figure 8:
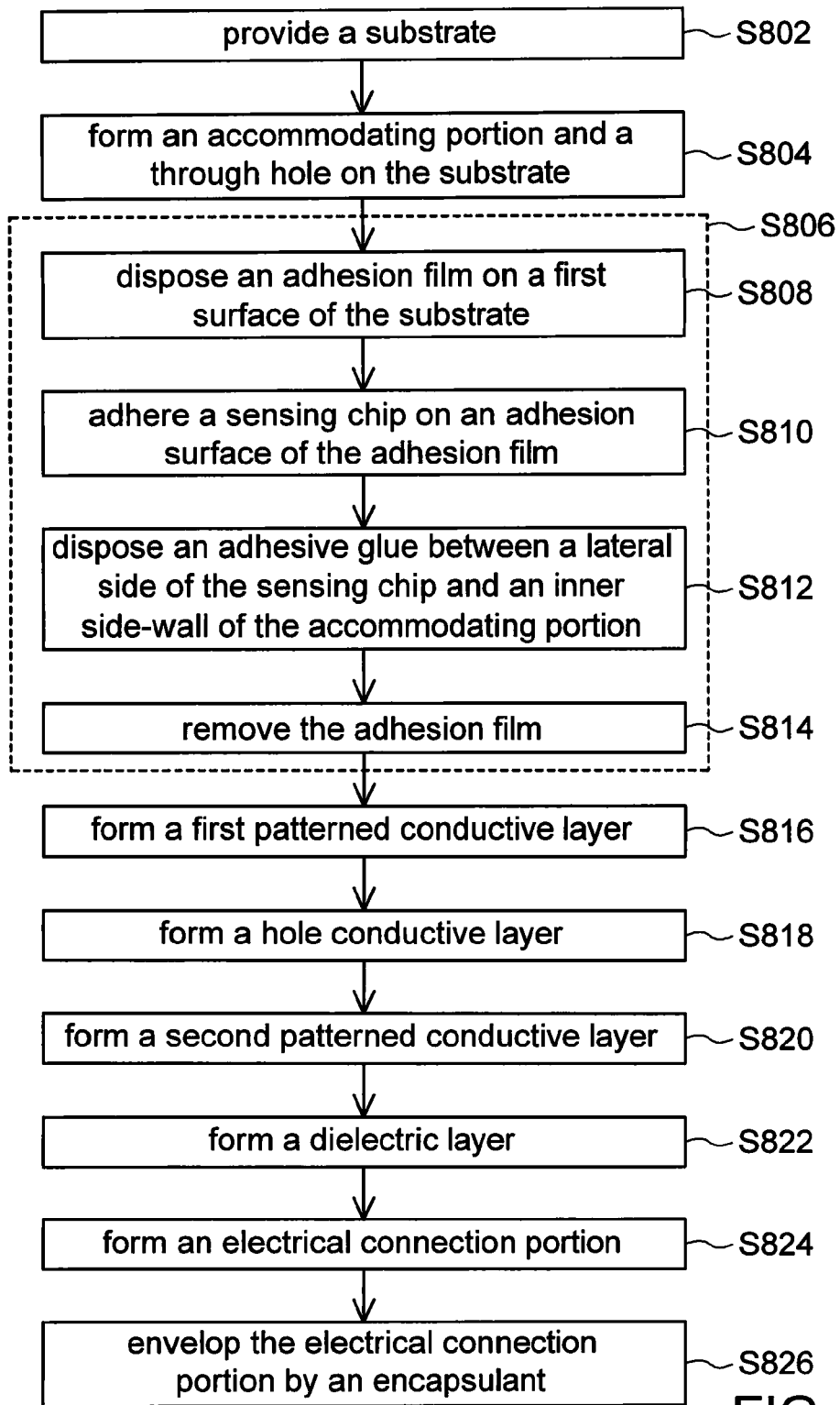
FIG. 8 shows a flowchart of a package method of a semiconductor package structure according to a third embodiment of the invention.
Figure 9A:
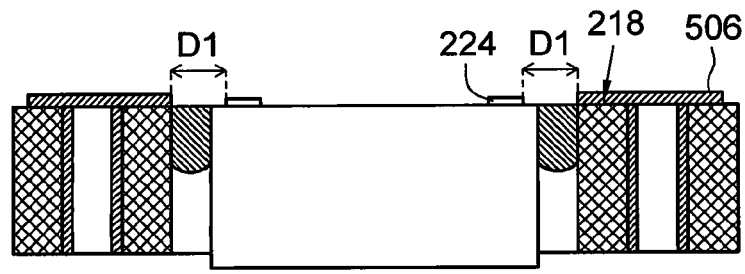
FIGS. 9A-9C show the process of manufacturing the semiconductor package structure of FIG. 7.
Figure 9B:
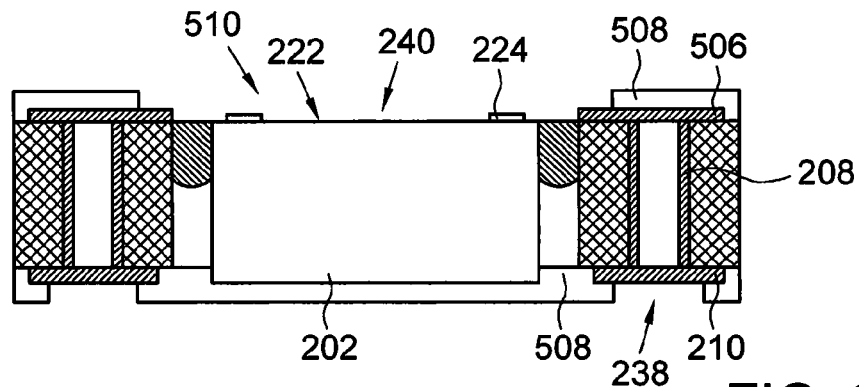
Figure 9C:
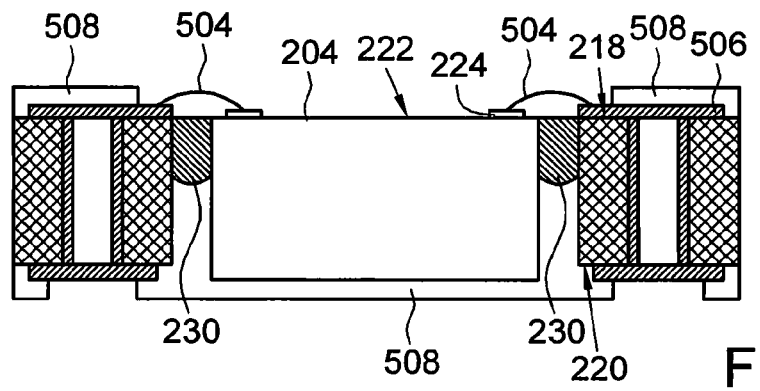

Referring to FIG. 8, a flowchart of a package method of a semiconductor package structure according to a third embodiment of the invention is shown. The present embodiment is elaborated by accompanying drawings as illustrated in FIGS. 9A~9C. FIGS. 9A~9C show the process of manufacturing the semiconductor package structure of FIG. 7. As steps S802~S814 of FIG. 8 are similar to steps S302~S314 of FIG. 3, the similarities are not repeated here, the following disclosure starts with step S816.

The method proceeds to step S816, also referring to FIG. 9A, a first patterned conductive layer 506 is formed on the first surface 218. There is a distance D1 formed between the first patterned conductive layer 506 and the pad 224. That is, the first patterned conductive layer 506 and the pad 224 are not interconnected.

In steps S818 and S820, the hole conductive layer 208 and the second patterned conductive layer 210 are respectively formed, wherein as steps S818 and S820 are similar to steps S318 and S320 of FIG. 2, the similarities are not repeated here.

Then, the method proceeds to step S822, also referring to FIG. 9B, a dielectric layer 508, such as a solder mask, is formed on a part (not illustrated) of the first patterned conductive layer 506 and the second patterned conductive layer 210. The dielectric layer 508 has a first aperture 510 and a second aperture 238, wherein the first aperture 510 exposes the other part (not illustrated) of the first patterned conductive layer 506 and the sensing area 240 of the active surface 222, and the second aperture 238 exposes a part (not illustrated) of the second patterned conductive layer 210.

After that, the method proceeds to step S824, also referring to FIG. 9C, a electrical connection portion, such as a wire 504, electrically connects the first patterned conductive layer 506 and the pad 224, wherein one end of the wire 504 is connected to the pad 224, and the other end is connected to the other part of the first patterned conductive layer 506.

Thereafter, the method proceeds to step S826, the dielectric layer 508, the wire 504 and the adhesive glue 230 of FIG. 9C are enveloped by the encapsulant 512 and the sensing area 240 of the sensing chip 204 is exposed to form the semiconductor package structure 500 of FIG. 7.

As the sensing chip 204 buried in the substrate 202, the height H2 of the whole semiconductor package structure 500 is lower than the height H1 of the generally known semiconductor package structure 100 of FIG. 1, hence being conformed to the trend of thinness, compactness and lightweight.

Fourth Embodiment

Figure 10:
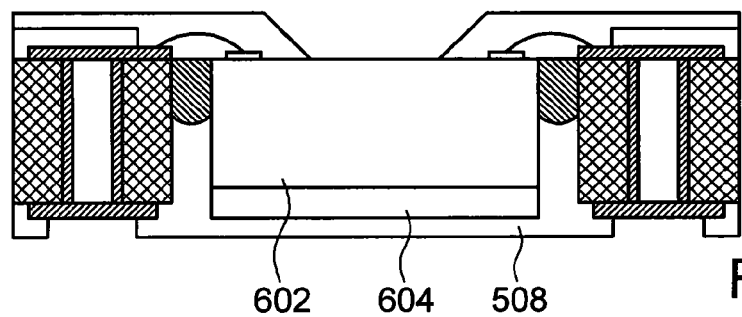
FIG. 10 shows a semiconductor package structure according to a fourth embodiment of the invention.

Referring to FIG. 10, a semiconductor package structure according to a fourth embodiment of the invention is shown. For the similarities between the fourth embodiment and the third embodiment, the same designations are used, and the similarities are not repeated here. The semiconductor package structure 600 of the fourth embodiment differs with the semiconductor package structure 500 of the third embodiment in that: the semiconductor package structure 600 further includes a die attach film 604.

Like the disclosure of the second embodiment, the die attach film 604 of the fourth embodiment is located between the sensing chip 602 and the dielectric layer 508, so that the contact area between the sensing chip 602 and the dielectric layer 508 is reduced, hence avoiding fragmentation occurring to the connection between the sensing chip 602 and the dielectric layer 508 due to the area of connection being too large when the elements expand and contract as temperature changes.

The semiconductor package structure and the package method thereof disclosed in the above embodiments of the invention have many advantages exemplified below:

(1). The first patterned conductive layer, the hole conductive layer and the second patterned conductive layer can be formed at the same time, hence reducing the time of the manufacturing process.

(2). The sensing chip is buried in the substrate, so the height of the whole semiconductor package structure is lower than the height H1 of the generally known semiconductor package structure 100 of FIG. 1, hence being conformed to the trend of thinness, compactness and lightweight.

(3). The electrical connection portion electrically connects the first patterned conductive layer and the sensing chip, and the electrical connection portion and the first patterned conductive layer can be formed in the same process, such as the electro-plating process. Furthermore, a very thin dielectric layer can be formed by way of screen printing to envelop the electrical connection portion. As the dielectric layer is very thin, the whole semiconductor package structure is conformed to the trend of thinness, compactness and lightweight.

(4). As the first opening exposed on the sensing area can be formed by way of exposing and developing, the first opening can precisely expose the sensing area of the sensing chip.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor package structure, comprising:
   a substrate having an accommodating portion, a through hole, a first surface and a second surface opposite to the first surface, wherein the accommodating portion and the through hole are extended to the second surface from the first surface;
   a sensing chip disposed in the accommodating portion, wherein the sensing chip has an active surface and a chip surface opposite to the active surface and comprises a pad located on the active surface;
   a first patterned conductive layer formed on the first surface;
   a hole conductive layer formed on the through hole and connected to the first patterned conductive layer;
   a second patterned conductive layer formed on the second surface and connected to the hole conductive layer;
   an electrical connection portion used for electrically connecting the pad and the first patterned conductive layer;
   a die attach film (DAF) adhered to the chip surface; and
   a dielectric layer covering the first patterned conductive layer, the sensing chip, the electrical connection portion, the second patterned conductive layer and the die attach film, wherein the dielectric layer has a first aperture and a second aperture, the first aperture exposes a part of the active surface, and the second aperture exposes a part of the second patterned conductive layer.

2. The semiconductor package structure according to claim 1, wherein the electrical connection portion is extended from the first patterned conductive layer.

3. The semiconductor package structure according to claim 1, wherein the electrical connection portion is integrated with the first patterned conductive layer.

4. The semiconductor package structure according to claim 1, wherein the pad and the first patterned conductive layer are separated by a distance, the electrical connection portion is a wire, the dielectric layer covers a part of the first patterned conductive layer, and the semiconductor package structure further comprises:
   an encapsulant enveloping the wire;
   wherein, one end of the wire is connected to the pad, and the other end of the wire is connected to the other part of the first patterned conductive layer.

5. The semiconductor package structure according to claim 1, wherein a lateral side of the sensing chip and an inner side-wall of the accommodating portion are separated by a gap, and the semiconductor package structure further comprises:
   an adhesive glue disposed in p the gap, wherein the adhesive glue connects the lateral side of the sensing chip to the inner side-wall of the accommodating portion for fixing the sensing chip on the accommodating portion.

6. The semiconductor package structure according to claim 5, wherein the adhesive glue is a thermal cure resin.

7. The semiconductor package structure according to claim 5, wherein the adhesive glue is a copper-containing adhesive glue.

8. The semiconductor package structure according to claim 1, wherein the pad has a pad surface, and the pad surface, the active surface and the first surface substantially face the same direction;
wherein, the pad surface and the first surface are substantially aligned.

9. The semiconductor package structure according to claim 1, wherein the pad is protruded from the active surface, the pad has a pad surface, and the pad surface, the active surface and the first surface substantially face the same direction;
wherein, the pad surface is protruded from the first surface.

10. The semiconductor package structure according to claim 1, further comprising:
an organic solderability preservative (OSP) film formed on the second patterned conductive layer.

11. The semiconductor package structure according to claim 1, wherein the substrate is a cupper-clad laminate.

12. A package method of a semiconductor package structure, wherein the method comprises:
providing a substrate, wherein the substrate has a first surface and a second surface;
forming an accommodating portion and a through hole on the substrate, wherein the accommodating portion and the through hole are extended to the second surface from the first surface;
disposing a sensing chip in the accommodating portion, wherein the sensing chip has an active surface and a chip surface opposite to the active surface, the sensing chip comprises a pad located on the active surface, and a die attach film is disposed on the chip surface;
forming a first patterned conductive layer on the first surface;
forming a hole conductive layer in the through hole, wherein the through hole is connected to the first patterned conductive layer;
forming a second patterned conductive layer on the second surface, wherein the second patterned conductive layer is connected to the hole conductive layer; and
forming an electrical connection portion between the pad and the first patterned conductive layer for electrically connecting the pad to the first patterned conductive layer;
forming a dielectric layer on the first patterned conductive layer, the sensing chip, the electrical connection portion, and the second patterned conductive layer, wherein the step of forming the dielectric layer comprises forming the dielectric layer on the die attach film; and
forming a first aperture and a second aperture on the dielectric layer, wherein the first aperture exposes a part of the active surface, and the second aperture exposes a part of the second patterned conductive layer.

13. The package method according to claim 12, wherein the electrical connection portion is extended from the first patterned conductive layer, and the step of forming the first patterned conductive layer and the step of forming the electrical connection portion are performed at the same time.

14. The package method according to claim 12, wherein the electrical connection portion is a wire,
the step of forming the dielectric layer on the first patterned conductive layer is forming the dielectric layer on a part of the first patterned conductive layer,
the step of forming the electrical connection portion comprises:
electrically connecting the other part of the first patterned conductive layer and the pad by the wire; and the package method further comprises:
enveloping the wire by an encapsulant.

15. The package method according to claim 12, wherein the accommodating portion exposes an opening on the first surface, and the step of disposing the sensing chip in the accommodating portion comprises:
disposing an adhesion film on the first surface, so that the adhesion film covers the aperture;
adhering the sensing chip on an adhesion surface of the adhesion film, wherein the active surface of the sensing chip faces the adhesion surface;
disposing an adhesive glue between a lateral side of the sensing chip and an inner side-wall of the accommodating portion for fixing the sensing chip on the accommodating portion; and
removing the adhesion film.

* * * * *